(12) United States Patent
Hayashi

(10) Patent No.: US 11,588,462 B2
(45) Date of Patent: Feb. 21, 2023

(54) ACOUSTIC WAVE DEVICE

(71) Applicant: Murata Manufacturing Co., Ltd., Nagaokakyo (JP)

(72) Inventor: Yasunobu Hayashi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 386 days.

(21) Appl. No.: 16/801,364

(22) Filed: Feb. 26, 2020

(65) Prior Publication Data
US 2020/0287516 A1 Sep. 10, 2020

(30) Foreign Application Priority Data

Mar. 6, 2019 (JP) ................................ 2019-040184

(51) Int. Cl.
*H03H 9/02* (2006.01)
*H03H 9/25* (2006.01)
*H03H 9/13* (2006.01)
*H03H 9/64* (2006.01)

(52) U.S. Cl.
CPC ........ *H03H 9/02574* (2013.01); *H03H 9/131* (2013.01); *H03H 9/25* (2013.01); *H03H 9/6453* (2013.01)

(58) Field of Classification Search
CPC ............... H03H 9/02574; H03H 9/131; H03H 9/14541; H03H 9/25; H03H 9/6453
USPC ............................ 310/313 C, 113 R; 333/193
See application file for complete search history.

(56) References Cited

U.S. PATENT DOCUMENTS

| 7,471,027 | B2 * | 12/2008 | Kando ................. | H03H 9/0222 310/313 R |
| 11,050,406 | B2 * | 6/2021 | Maki .................. | H03H 9/02834 |
| 2004/0095038 | A1 * | 5/2004 | Takase ............... | H03H 9/14541 310/313 R |
| 2005/0146249 | A1 * | 7/2005 | Miyazawa ........... | H03H 9/0542 310/358 |
| 2005/0174012 | A1 * | 8/2005 | Ozaki ................ | H03H 9/14541 310/313 B |
| 2010/0181869 | A1 * | 7/2010 | Pereira da Cunha ........................ | H03H 9/14541 310/313 R |
| 2012/0133246 | A1 * | 5/2012 | Yaoi ....................... | H03H 9/131 310/313 C |
| 2012/0256522 | A1 * | 10/2012 | Ito ....................... | G01R 33/0052 29/25.35 |
| 2013/0285768 | A1 * | 10/2013 | Watanabe ................ | H03H 3/02 333/193 |
| 2014/0232239 | A1 * | 8/2014 | Iwasaki .................. | H03H 9/131 310/313 C |
| 2015/0325775 | A1 * | 11/2015 | Shimizu .................... | H03H 3/08 29/25.35 |

(Continued)

FOREIGN PATENT DOCUMENTS

JP 2008-244523 A 10/2008

*Primary Examiner* — Tan H Trinh
(74) *Attorney, Agent, or Firm* — Keating & Bennett, LLP

(57) ABSTRACT

An acoustic wave device includes a piezoelectric layer and an interdigital transducer disposed on the piezoelectric layer. The interdigital transducer primarily includes Al and includes an additive selected from a group consisting of Nd, Sc, and Ta, and a concentration of the additive in a region opposite to a piezoelectric-layer-side region of the interdigital transducer is higher than a concentration of the additive in the piezoelectric-layer-side region of the interdigital transducer.

18 Claims, 3 Drawing Sheets

(56) References Cited

U.S. PATENT DOCUMENTS

| | | | | |
|---|---|---|---|---|
| 2017/0085246 | A1* | 3/2017 | Shih | H03H 9/02834 |
| 2017/0085247 | A1* | 3/2017 | Ruby | H03H 9/02574 |
| 2017/0214385 | A1* | 7/2017 | Bhattacharjee | H03H 9/14564 |
| 2017/0222622 | A1* | 8/2017 | Solal | H03H 9/02551 |
| 2017/0279429 | A1* | 9/2017 | Iwamoto | H03H 3/08 |
| 2017/0338796 | A1* | 11/2017 | Morimoto | H03H 3/08 |
| 2017/0366165 | A1* | 12/2017 | Shih | H03H 9/25 |
| 2018/0205403 | A1* | 7/2018 | Konno | H03H 9/02559 |
| 2019/0140618 | A1* | 5/2019 | Takamine | H03H 9/02559 |
| 2019/0149126 | A1* | 5/2019 | Saji | H03H 9/14541 |
| | | | | 333/195 |
| 2020/0007107 | A1* | 1/2020 | Daimon | H03H 9/0009 |
| 2020/0083862 | A1* | 3/2020 | Makkonen | H03H 9/173 |
| 2020/0162052 | A1* | 5/2020 | Matsuoka | H03H 9/02535 |
| 2020/0295731 | A1* | 9/2020 | Koyanagi | H03H 9/0557 |
| 2021/0083654 | A1* | 3/2021 | Bertl | H03H 9/02543 |
| 2021/0135655 | A1* | 5/2021 | Fukuhara | H03H 9/14541 |
| 2021/0152153 | A1* | 5/2021 | Kishino | H03H 9/25 |
| 2021/0367577 | A1* | 11/2021 | Aigner | H03H 3/08 |

* cited by examiner

ACOUSTIC WAVE DEVICE

CROSS REFERENCE TO RELATED APPLICATIONS

This application claims the benefit of priority to Japanese Patent Application No. 2019-040184 filed on Mar. 6, 2019. The entire contents of this application are hereby incorporated herein by reference.

BACKGROUND OF THE INVENTION

1. Field of the Invention

The present invention relates to an acoustic wave device including an electrode layer that primarily includes Al.

2. Description of the Related Art

To date, alloy layers primarily composed of Al have been widely used for interdigital transducers of acoustic wave devices. For example, Japanese Unexamined Patent Application Publication No. 2008-244523 discloses an interdigital transducer having a composition made by adding an additive, for example, Ni or Nd, to Al.

When an interdigital transducer composed of Al is placed under high-temperature conditions, there is a problem that hillocks occur and electric power handling capability deteriorates. As described in Japanese Unexamined Patent Application Publication No. 2008-244523, when an additive, for example, Nd, is added, Al crystal grains do not move smoothly. Therefore, it is considered that hillocks do not readily occur.

However, in practice, even when the additive described in Japanese Unexamined Patent Application Publication No. 2008-244523 is added to Al, exposure to a high temperature may cause hillocks with respect to the surface of an interdigital transducer so as to degrade electric power handling capability.

SUMMARY OF THE INVENTION

Preferred embodiments of the present invention provide acoustic wave devices each having excellent electric power handling capability.

According to a preferred embodiment of the present invention, an acoustic wave device includes a piezoelectric layer and an interdigital transducer disposed on the piezoelectric layer, in which the interdigital transducer primarily includes Al and includes an additive selected from a group consisting of Nd, Sc, and Ta, and a concentration of the additive in a region opposite to a piezoelectric-layer-side region of the interdigital transducer is higher than a concentration of the additive in the piezoelectric-layer-side region of the interdigital transducer.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

The present invention will be clarified below by describing specific preferred embodiments according to the present invention with reference to the drawings.

It is to be noted that each of the preferred embodiments described in the present specification is an example and that configurations shown in different preferred embodiments can be partially replaced or combined with each other.

Figure 1A:
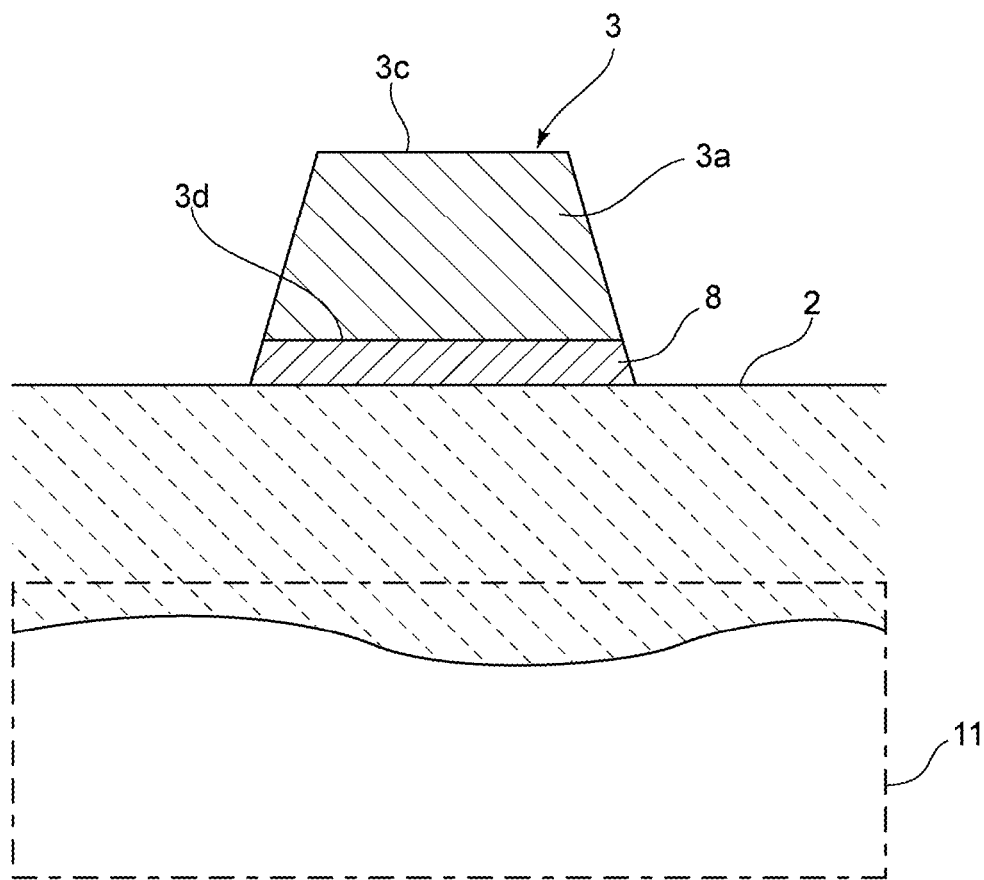
FIG. 1A is a magnified portion of a sectional front view showing a key portion of an interdigital transducer of an acoustic wave device according to a preferred embodiment of the present invention.
Figure 1B:
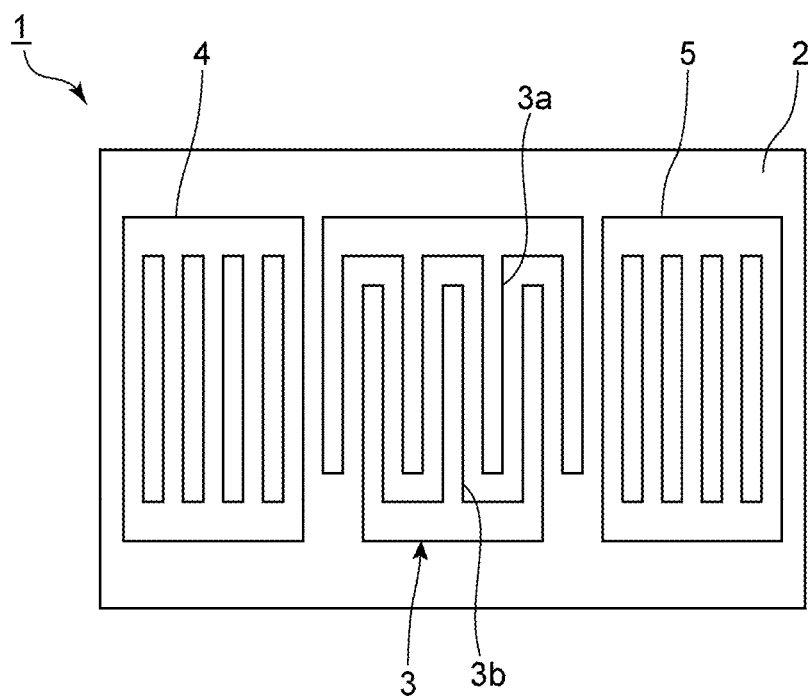
FIG. 1B is a plan view of the acoustic wave device.

FIG. 1A is a magnified portion of a sectional front view showing a key portion of an interdigital transducer of an acoustic wave device according to a preferred embodiment of the present invention, and FIG. 1B is a plan view of the acoustic wave device.

The acoustic wave device 1 includes a piezoelectric substrate 2 defining and functioning as a piezoelectric layer. An electrode structure shown in FIG. 1B is disposed on the piezoelectric substrate 2. The electrode structure includes an interdigital transducer 3 and reflectors 4 and 5 disposed on respective sides of the interdigital transducer 3 in the acoustic wave propagation direction.

The piezoelectric substrate 2 is preferably made of, for example, a piezoelectric single crystal of $LiNbO_3$, $LiTaO_3$, or the like or piezoelectric ceramics. A piezoelectric layer defined by a thin piezoelectric film rather than the piezoelectric substrate 2 may be used, for example.

As shown in FIG. 1B, the interdigital transducer 3 includes a plurality of first electrode fingers 3a and a plurality of second electrode fingers 3b. The plurality of first electrode fingers 3a and the plurality of second electrode fingers 3b are interdigitated with each other. FIG. 1A shows a magnified portion in which the first electrode fingers 3a are disposed. The interdigital transducer 3 is preferably made of a material that primarily includes Al and that includes an additive selected from a group consisting of Nd, Sc, and Ta, for example.

A close-contact layer 8 defining and functioning as another metal layer is disposed between the interdigital transducer 3 and the piezoelectric substrate 2. The close-contact layer 8 is preferably made of Ti, for example. The close-contact layer 8 may be made of another metal, for example, NiCr or Cr.

In the acoustic wave device 1, the concentration of the additive in the periphery of the upper surface 3c, which is the region opposite to the periphery of the lower surface 3d defining and functioning as the piezoelectric-layer-2-side region, is higher than the concentration of the additive in the periphery of the lower surface 3d defining and functioning as the piezoelectric-layer-2-side region in the interdigital transducer 3, where the piezoelectric substrate 2 is a piezoelectric layer. In this regard, the concentration of the additive in the piezoelectric-layer-2-side region may be equal or substantially equal to the concentration of the additive in at least a portion of the piezoelectric-layer-2-side region, and the concentration of the additive in the region opposite to the piezoelectric-layer-2-side region may be equal or substantially equal to the concentration of the additive in at least a portion of the region opposite to the piezoelectric-layer-2-side region. That is, the portion having a relatively high concentration of the additive has to be located farther than the portion having a relatively low concentration of the additive from the piezoelectric substrate 2.

The inventor of preferred embodiments of the present invention performed research on the occurrence of hillocks. As a result, it was discovered that hillocks could be more effectively reduced or prevented from occurring when the concentration of the additive in the periphery of the upper surface 3c was higher than the concentration in the periphery of the lower surface 3d, and preferred embodiments of the present invention were conceived of and developed. It is considered that, in the region in which hillocks tend to occur compared with the piezoelectric-layer-2-side region and which is opposite to the piezoelectric-layer-2-side region, hillocks can be reduced or prevented from occurring because Al crystal grains do not readily move if an additive such as Nd, for example, is added, even when the Al crystal grains are exposed to a high temperature.

In this regard, it is difficult to measure the concentration of the upper surface 3c of the interdigital transducer 3. Even when such measurement can be performed, it is difficult to obtain a correct value because of significant noise. Therefore, the concentration of the additive at the position at a distance of about 20% of the thickness of the interdigital transducer 3 from the upper surface 3c of the interdigital transducer 3 is specified to be higher than the concentration of the additive at the position at a distance of about 80% of the thickness of the interdigital transducer 3 from the upper surface 3c. The above-described concentrations of the additive at the position at a distance of about 20% of the thickness of the interdigital transducer 3 and at the position at a distance of about 80% of the thickness can be readily measured with high accuracy compared with the concentration of the upper surface 3c of the interdigital transducer 3. In this regard, the concentration of the additive at the position at a distance of about 20% of the thickness of the interdigital transducer 3 from the upper surface 3c of the interdigital transducer 3 denotes the concentration of the additive at the position at a distance of about 20% of the thickness of the interdigital transducer 3 from the upper surface 3c of the interdigital transducer 3 when a cross section of the interdigital transducer 3 is viewed in the direction orthogonal or substantially orthogonal to the extension direction of the electrode finger in the interdigital transducer 3 (acoustic wave propagation direction). In other words, the above-described concentration denotes the concentration of the additive in a portion including at least one point on a straight line when the straight line is drawn so as to pass through positions at a distance of about 20% of the thickness of the interdigital transducer 3 from the upper surface 3c of the interdigital transducer 3 in a cross section of the interdigital transducer 3 cut in the acoustic wave propagation direction. Meanwhile, the concentration of the additive at the position at a distance of about 80% of the thickness of the interdigital transducer 3 from the upper surface 3c of the interdigital transducer 3 denotes the concentration of the additive at the position at a distance of about 80% of the thickness of the interdigital transducer 3 from the upper surface 3c of the interdigital transducer 3 when a cross section of the interdigital transducer 3 is viewed in the direction orthogonal or substantially orthogonal to the extension direction of the electrode finger in the interdigital transducer 3 (acoustic wave propagation direction). In other words, the above-described concentration denotes the concentration of the additive in a portion including at least one point on a straight line when the straight line is drawn so as to pass through positions at a distance of about 80% of the thickness of the interdigital transducer 3 from the upper surface 3c of the interdigital transducer 3 in a cross section of the interdigital transducer 3 cut in the acoustic wave propagation direction.

Figure 2:
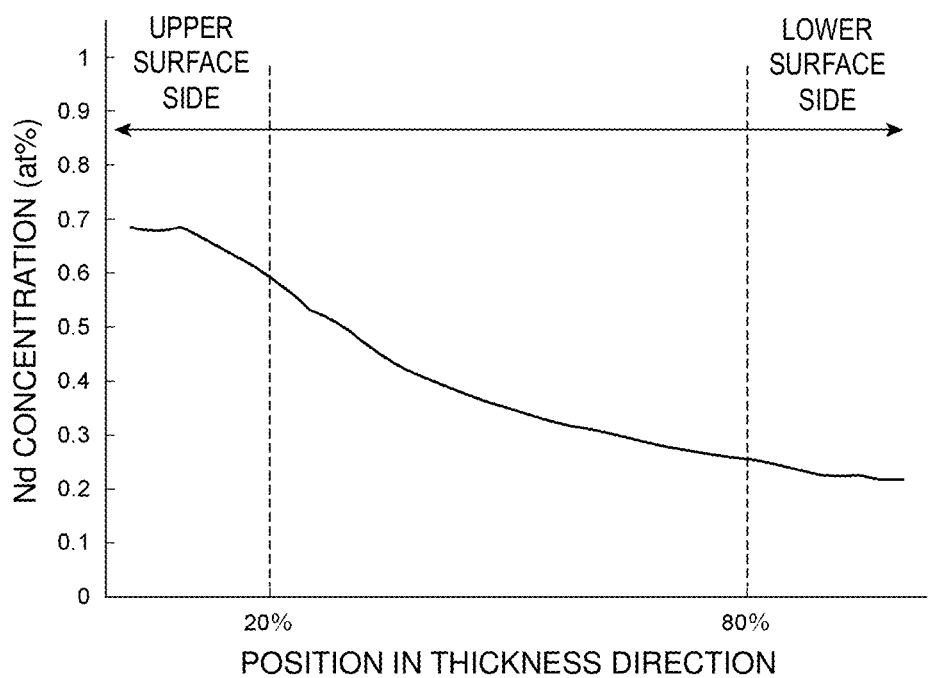
FIG. 2 is a diagram showing the relationship between the position in the thickness direction and the Nd concentration in an electrode layer in which Nd is added to Al in an interdigital transducer.

FIG. 2 is a diagram showing the relationship between the position in the thickness direction of an electrode layer in the electrode finger and the concentration of Nd as the additive in the acoustic wave device 1 according to the present preferred embodiment. As shown clearly in FIG. 2, in the present preferred embodiment, the concentration of the additive decreases from the upper surface 3c side toward the lower surface 3d side. It is preferable that the concentration decreases continuously. In this case, since the stress due to a difference in the coefficient of linear expansion between Al and the additive can be reduced, the interdigital transducer can be reduced or prevented from being broken. However, a region in which the concentration does not decrease may be provided in a portion in the thickness direction. That is, the concentration may vary stepwise from the upper surface 3c side toward the lower surface 3d side.

Regarding the acoustic wave device 1, since the above-described concentration gradient of Nd as the additive exists in the interdigital transducer 3, hillocks do not readily occur. Therefore, the electric power handling capability can be improved. This will be described with reference to specific experimental examples.

A piezoelectric substrate made of $LiTaO_3$ was used as the piezoelectric substrate 2. A Ti film having a thickness of about 12 nm was formed as the close-contact layer 8 on the piezoelectric substrate 2 by using evaporation. Subsequently, an Al—Nd film was formed by using an evaporation method where the evaporation sources were Al and Nd. The concentration of Nd was set to be about 0.5 atomic percent of the entire interdigital transducer 3, and the thickness of the Al—Nd film was set to be about 145 nm.

The thus obtained acoustic wave device 1 was subjected to a power handling test.

Figure 3:
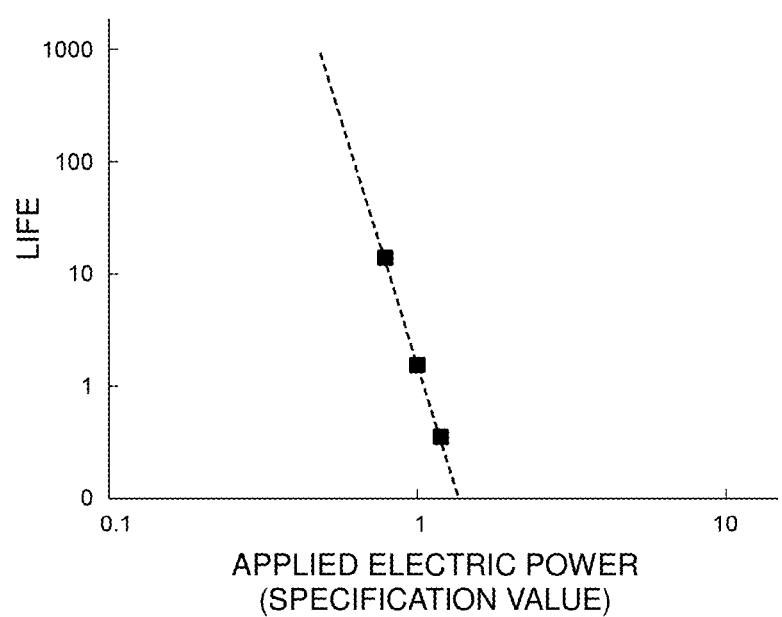
FIG. 3 is a diagram showing the results of a power handling test of an acoustic wave device according to a preferred embodiment of the present invention.

FIG. 3 shows the results of the power handling test.

As shown in FIG. 3, regarding the acoustic wave device according to the present preferred embodiment, a long service life was obtained. Such a result is assumed to be due to a reduction in the size of Al crystal grains and improvement of film strength in accordance with the Hall-Petch Law as a result of forming the Al—Nd film by using evaporation and setting the above-described concentration gradient. Consequently, hillocks can be more effectively reduced or prevented from occurring, and the electric power handling capability can be improved, as described above.

In the above-described preferred embodiment, Nd was used as the additive. However, it was ascertained that even when Sc or Ta was used, hillocks can be reduced or prevented and the electric power handling capability can be improved by setting the concentration gradient of the additive in the same or substantially the same manner as above.

The content of the additive, for example, Nd, in Al—Nd is preferably about 10 atomic percent or less and more preferably about 1 atomic percent or less, for example. In such a case, the electrical conductivity of the interdigital transducer 3 can be sufficiently improved. Therefore, a low-loss acoustic wave device can be provided.

The acoustic wave device 1 may include a support substrate 11 as indicated by alternate long and short dashed lines in FIG. 1A. In such a case, a thin piezoelectric film may be used in place of the piezoelectric substrate 2 to define and function as a piezoelectric layer. There is no particular limitation regarding the material used for the support substrate 11, and semiconductors such as, for example, Si and dielectrics such as $Al_2O_3$ may preferably be used.

Further, an acoustic multilayer film or a high-acoustic-velocity material layer may be stacked between the support substrate and the piezoelectric layer. The acoustic multilayer film denotes a multilayer film in which a high-acoustic-impedance layer having relatively high acoustic impedance and a low-acoustic-impedance layer having relatively low acoustic impedance are stacked. The high-acoustic-velocity material layer denotes a layer made of a material through which a bulk wave propagates at an acoustic velocity higher than the acoustic velocity of a bulk wave that propagates through the piezoelectric substrate 2.

Figure 4:
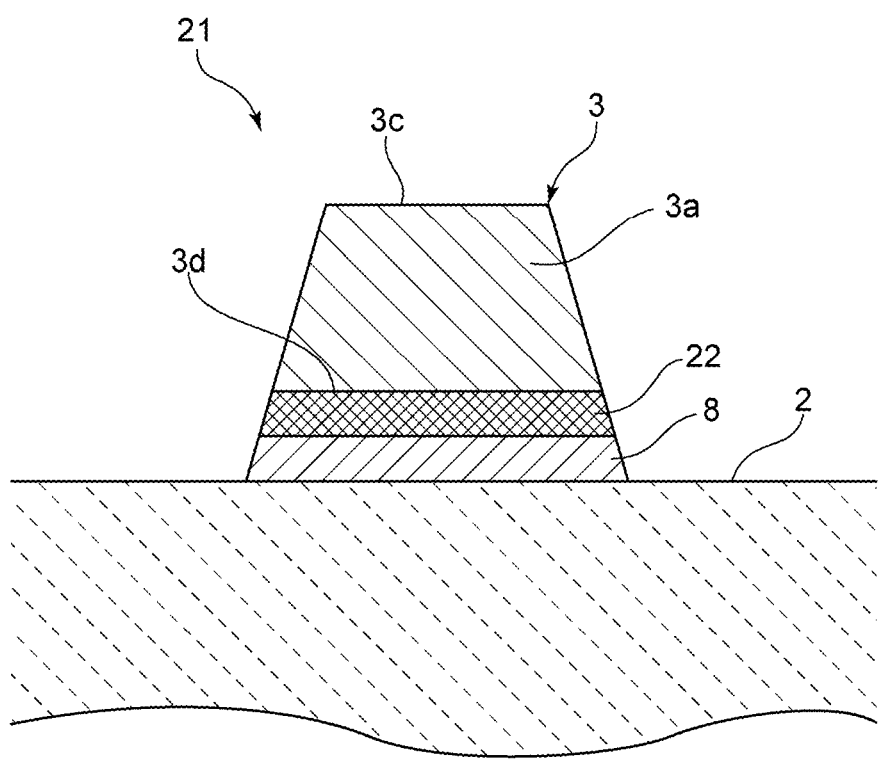
FIG. 4 is a magnified portion of a sectional front view showing a key portion of an electrode structure of an acoustic wave device according to another preferred embodiment of the present invention.

FIG. 4 is a magnified portion of a sectional front view illustrating an acoustic wave device according to another preferred embodiment of the present invention.

FIG. 4 is a sectional view of a portion corresponding to the portion shown in FIG. 1A. In the acoustic wave device 21, regarding a first electrode finger 3a of the interdigital transducer 3, a metal layer 22 that defines and functions as an intermediate layer is further disposed between the interdigital transducer 3 and the close-contact layer 8. As described above, the metal layer 22 may be further stacked between the interdigital transducer 3 and the close-contact layer 8. In this case, other electrode layers include a plurality of metal layers.

In addition, a low-acoustic-velocity material layer may be further stacked between the high-acoustic-velocity material layer and the piezoelectric substrate 2. The low-acoustic-velocity material layer denotes a layer made of a material through which a bulk wave propagates at an acoustic velocity lower than the acoustic velocity of a bulk wave that propagates through the piezoelectric substrate 2.

FIG. 1B shows the electrode structure of the acoustic wave device 1 that is a one-port acoustic wave resonator. However, the electrode structures of the acoustic wave devices according to preferred embodiments of the present invention is not limited to a one-port acoustic wave resonator.

Preferred embodiments of the present invention can also be applied to acoustic wave filters, for example, a longitudinally coupled resonator acoustic wave filter.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
   a piezoelectric layer; and
   an interdigital transducer disposed on the piezoelectric layer; wherein
   the interdigital transducer primarily includes Al and includes an additive selected from a group consisting of Nd, Sc, and Ta; and
   a concentration of the additive in a region opposite to a piezoelectric-layer-side region of the interdigital transducer is higher than a concentration of the additive in the piezoelectric-layer-side region of the interdigital transducer.

2. The acoustic wave device according to claim 1, wherein a concentration of the additive varies continuously in a thickness direction of the interdigital transducer.

3. The acoustic wave device according to claim 1, wherein the additive is Nd.

4. The acoustic wave device according to claim 1, further comprising a metal layer stacked on the interdigital transducer and made of a metal different from a metal of the interdigital transducer.

5. The acoustic wave device according to claim 1, wherein the piezoelectric layer is made of a piezoelectric single crystal of $LiNbO_3$ or $LiTaO_3$.

6. The acoustic wave device according to claim 1, wherein the piezoelectric layer is a piezoelectric thin film.

7. The acoustic wave device according to claim 1, further comprising a close-contact layer between the interdigital transducer and the piezoelectric layer.

8. The acoustic wave device according to claim 7, wherein the close-contact layer is made of Ti, NiCr, or Cr.

9. The acoustic wave device according to claim 7, further comprising a metal layer defining an intermediate layer between the interdigital electrode and the close-contact layer.

10. An acoustic wave device comprising:
    a piezoelectric layer; and
    an interdigital transducer disposed on the piezoelectric layer; wherein
    the interdigital transducer primarily includes Al and includes an additive selected from a group consisting of Nd, Sc, and Ta; and
    a concentration of the additive at a position at a distance of about 20% of a thickness of the interdigital transducer from a surface opposite to a piezoelectric-layer-side surface of the interdigital transducer is higher than a concentration of the additive at a position at a distance of about 80% of the thickness of the interdigital transducer from the surface opposite to the piezoelectric-layer-side surface of the interdigital transducer.

11. The acoustic wave device according to claim 10, wherein a concentration of the additive varies continuously in a thickness direction of the interdigital transducer.

12. The acoustic wave device according to claim 10, wherein the additive is Nd.

13. The acoustic wave device according to claim 10, further comprising a metal layer stacked on the interdigital transducer and made of a metal different from a metal of the interdigital transducer.

14. The acoustic wave device according to claim 10, wherein the piezoelectric layer is made of a piezoelectric single crystal of $LiNbO_3$ or $LiTaO_3$.

15. The acoustic wave device according to claim 10, wherein the piezoelectric layer is a piezoelectric thin film.

16. The acoustic wave device according to claim 10, further comprising a close-contact layer between the interdigital transducer and the piezoelectric layer.

17. The acoustic wave device according to claim 16, wherein the close-contact layer is made of Ti, NiCr, or Cr.

18. The acoustic wave device according to claim 16, further comprising a metal layer defining an intermediate layer between the interdigital electrode and the close-contact layer.

* * * * *